United States Patent [19]
Aronowitz et al.

[11] Patent Number: 5,468,974
[45] Date of Patent: Nov. 21, 1995

[54] CONTROL AND MODIFICATION OF DOPANT DISTRIBUTION AND ACTIVATION IN POLYSILICON

[75] Inventors: Sheldon Aronowitz, San Jose; Yen-Hui J. Ku; Yu-Lam Ho, both of Cupertino, all of Calif.

[73] Assignee: LSI Logic Corporation, Milpitas, Calif.

[21] Appl. No.: 249,867

[22] Filed: May 26, 1994

[51] Int. Cl.$^6$ ................. H01L 29/04; H01L 21/265
[52] U.S. Cl. ................. 257/51; 257/52; 257/64; 257/65; 257/607; 257/611; 257/905; 437/27; 437/46; 437/152; 437/933; 437/934; 437/975
[58] Field of Search ................. 257/52, 51, 65, 257/64, 607, 611, 905; 437/27, 46, 152, 933, 934, 975

[56] References Cited

U.S. PATENT DOCUMENTS 3,773,566  11/1973  Tsuchimoto .
3,887,994  6/1975   Ku et al. .
3,925,106  12/1975  Ku et al. .
3,929,512  12/1975  Nicholas et al. .
4,368,083  1/1983   Bruel et al. .
4,683,645  8/1987   Naguib et al. ................. 257/65
4,689,667  8/1987   Aronowitz ................. 257/65
4,786,608  11/1988  Griffith ................. 257/65
5,095,358  3/1992   Aronowitz et al. .
5,108,954  4/1992   Sandhu et al. .
5,177,025  1/1993   Turner et al. .
5,192,712  3/1993   Aronowitz et al. .

*Primary Examiner*—Edward Wojciechowicz
*Attorney, Agent, or Firm*—Poms, Smith, Lande & Rose

[57] ABSTRACT

Dopant distribution and activation in polysilicon is controlled by implanting electrically neutral atomic species which accumulate along polysilicon grain boundaries. Exemplary atomic species include noble gases and Group IV elements other than silicon.

29 Claims, 6 Drawing Sheets

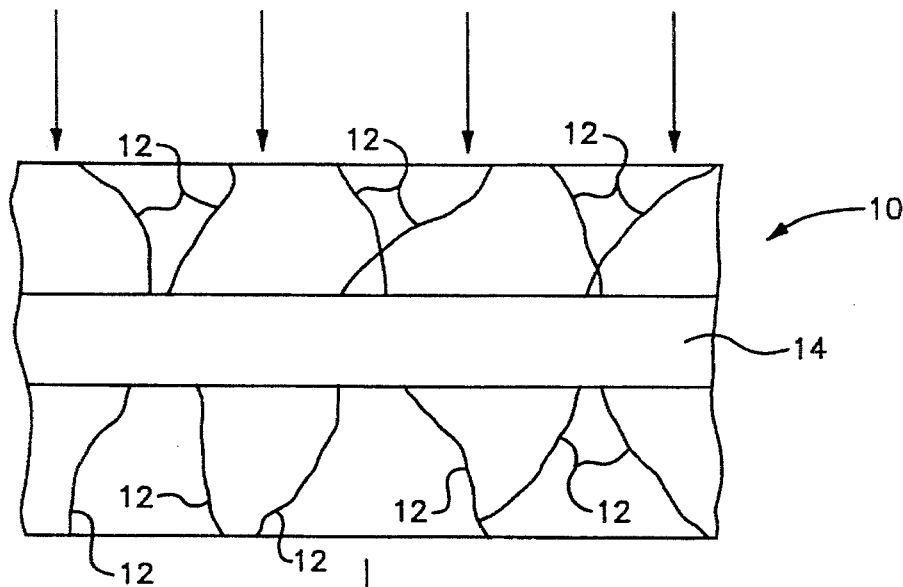
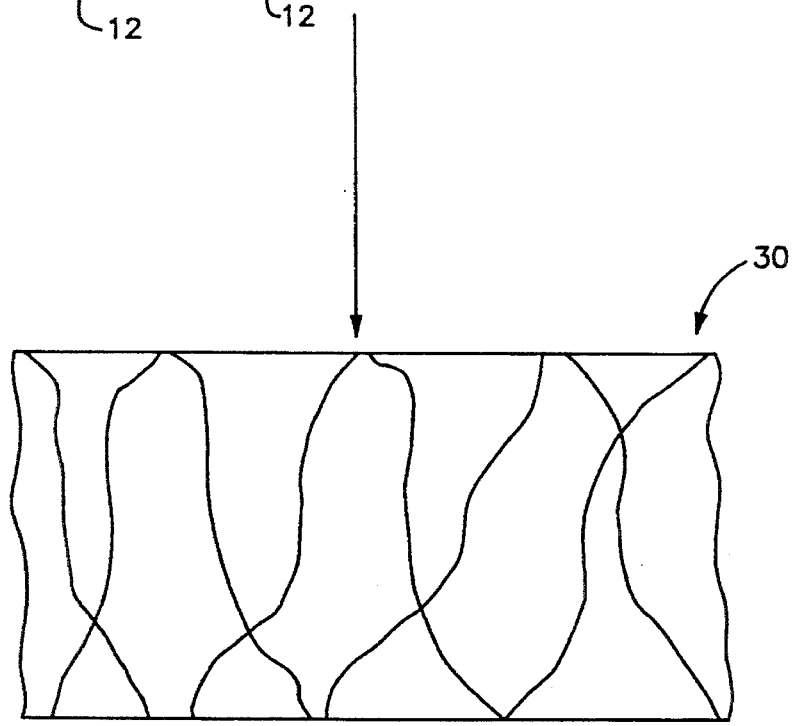
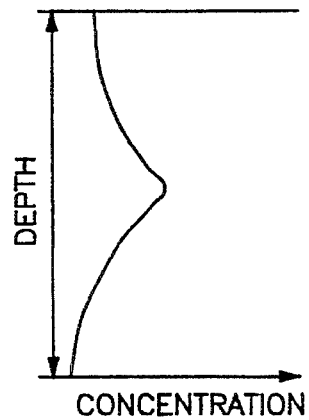
Fig.3  Fig.4

CONTROL AND MODIFICATION OF DOPANT DISTRIBUTION AND ACTIVATION IN POLYSILICON

BACKGROUND OF THE INVENTION

1. Field of the Invention

The present invention relates to a semiconductor structure having controllable spatial distributions of dopant impurity atoms and to a process for producing the semiconductor structure. The structure is further characterized by enabling controlled electrical activation of a portion of the dopant atoms present in the semiconductor.

2. Description of Related Art

In integrated circuit manufacture, efforts are constantly being directed towards development of smaller sized semiconductor components. An important limitation on the size of each component or each element of such component is the thickness of various doped regions, such as n- and p-type layers. For example, it is becoming more and more critical to control dopant distribution and activation in polysilicon gates as the thicknesses of polysilicon gates are reduced.

In order to provide semiconductor components for various applications, dopant atoms implanted into a semiconductor substrate must be activated for carrying out electrical operations in the component. Typically, dopant atoms are diffused within the semiconductor and activated by annealing at elevated temperatures for long periods of time. These high temperatures and long annealing times often result in the thickening of doped layers or lateral diffusion of dopant species. In some cases the net result is expansion of the doped area into undesired regions. In extreme situations the high temperature and long annealing times can lead to electrical shorting of regions which are intended to be electrically isolated from one another. As a result, it has been difficult to obtain the desired distribution of dopant atoms while at the same time electrically activating selected dopant regions.

Some measure of control of the spatial distribution and electrical activation of dopants in single crystal silicon has been reported. For example, the effect of implanted argon atoms upon boron distribution and activation has been described in the references, A. Milgram and M. Delfino, "Effect of Argon Implantation on the Activation of Boron Implanted in Silicon", Appl. Phys. Lett. 42, 878 (1983), and M. Delfino, A. Milgram, and M. D. Strathman, "Epitaxial Regrowth of Silicon Implanted with Argon and Boron", Appl. Phys. Lett. 44, 594 (1984), both of which are incorporated herein by reference.

The effect of argon and other noble gas dopants upon boron diffusion in single crystal silicon has also been modeled mathematically in the reference, Sheldon Aronowitz, "Quantum Chemical Modeling of Boron and Noble Gas Dopants in Silicon", J. Appl. Phys. 54, 3930 (1983), which is incorporated herein by reference.

The effect of interactions among various p- and n-type dopants in single crystal silicon has been described in the reference, S. Aronowitz, "Interaction Between Interstitial Atoms in Silicon: Arsenic-Argon-Boron and Boron-Argon-Phosphorus", J. Appl. Phys. 63., 1037 (1988), which is incorporated herein by reference.

The effect of germanium implantation upon dopant diffusion in single crystal silicon has been described in the references, Sheldon Aronowitz, "Dopant Diffusion Control in Silicon Using Germanium", J. Appl. Phys. 68, 3293 (1990) and S. Aronowitz, C. Hart, S. Myers, and P. Hale, "P-Type Dopant Diffusion Control in Silicon Using Germanium", J. Electrochem. Soc. 138, 1802 (1991), both of which are incorporated herein by reference.

Polysilicon, unlike single crystal silicon, is characterized by having numerous grain boundaries between crystals. Dopant diffusion along grain boundaries is a common occurrence and may lead to deactivation of dopant species. Thus, the control of dopant distribution and activation in polysilicon presents problems not encountered in single crystal silicon. Previously it has not been possible to control dopant distribution and activation in polysilicon.

Accordingly, it is a principal object of the present invention to provide a method of controlling dopant distribution and activation in polysilicon.

Another object of the present invention is to provide semiconductor structures in which dopant distribution in polysilicon layers is predetermined.

Another object of this invention is to provide a simple and convenient method for controlling the distribution and activation of dopant species in polysilicon by the implantation of electrically neutral atomic species.

Other objects and advantages of the present invention will become apparent in the course of the following detailed description and disclosure.

SUMMARY OF THE INVENTION

In accordance with the present invention, dopant distribution and activation in polysilicon is controlled by implanting atomic species which are electrically neutral in silicon and which will accumulate along polysilicon grain boundaries.

Atomic species which are effective for this purpose are noble gases and Group IV elements other than silicon. Such atomic species, which are electrically neutral in silicon, can be used in polysilicon to control diffusion of electrically active dopants of the p- or n-type as well as the activation of such dopants.

BRIEF DESCRIPTION Of THE DRAWINGS

FIG. 3 is a diagrammatic cross-sectional view of a process for controlling the distribution of boron within a polysilicon layer by argon implantation.

FIG. 4 illustrates the relative boron distribution in the polysilicon layer of FIG. 3 following annealing.

DESCRIPTION OF EXEMPLARY EMBODIMENTS

Figure 1:
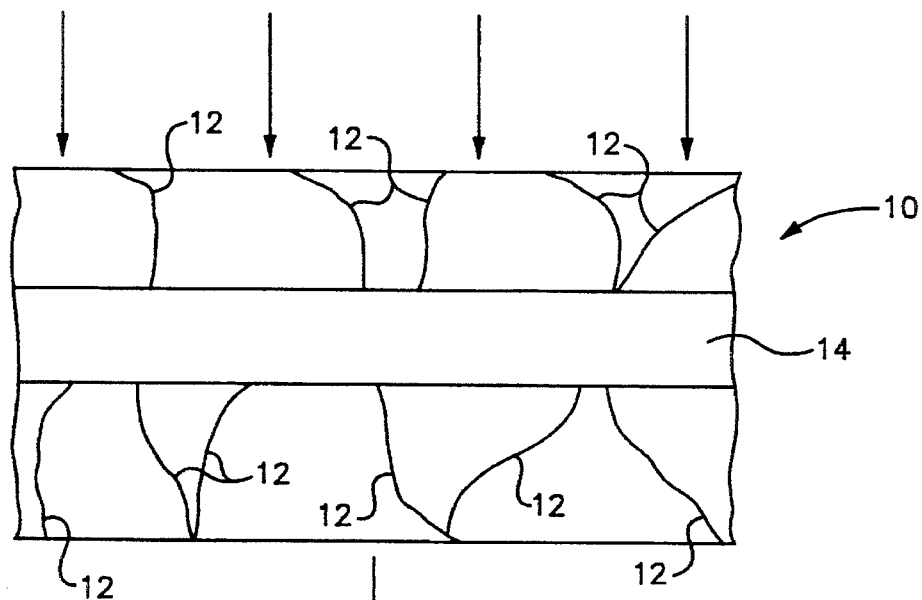
FIG. 1 is a diagrammatic cross-sectional view of a process for controlling the distribution of boron within a polysilicon layer by neon implantation.

Modification and control of dopant distribution and activation in polysilicon can be accomplished in several different ways. One method of modifying dopant distribution is by means of implanting atomic species which cannot enter into substitutional sites in silicon and which also block dopant diffusion along grain boundaries of polysilicon. Representative of such species are the noble gases, particularly argon, neon, and krypton.

For example, argon implanted at a nominal dose of $1 \times 10^{15}$ $Ar^+/cm^2$ will amorphize regions of polysilicon and will tend to accumulate along grain boundaries. Argon cannot participate in the crystal lattice of polysilicon and therefore cannot enter into substitutional sites in polysilicon. The dopant species, such as boron atoms, will tend to accumulate in regions that are rich in argon, particularly at grain boundaries, since argon forms a complex with boron. This results in reducing the effective diffusivity of boron along grain boundaries. This results in lowering the quantity of boron that piles up at the interface between the polysilicon gate in a MOS device and the gate oxide. This reduces undesired doping of the silicon in the region of the substrate and gate oxide.

In addition to boron other p-type dopants which can be used include aluminum, gallium and indium. Argon also interacts with n-type dopants, such as lithium, arsenic, phosphorus, antimony, and bismuth and can therefore be used to control diffusion and reduce activation of such dopants in selected regions of polysilicon. Such use of argon with n-type dopants is effective in creating controllably depleted regions in polysilicon.

Where, contrary to reducing the effective diffusivity of boron atoms, for example, it is desired to enhance their diffusivity, neon can be used, since boron and neon are mutually repelling rather than mutually attracting as is the case with boron and argon.

Another method of controlling dopant diffusion and activation in polysilicon is by implanting atomic species which, although capable of participating in the crystal lattice, are electrically inactive in the lattice. A particularly suitable atomic species for this purpose is germanium, which, being a Group IV element, is electrically inactive in the polysilicon lattice, since silicon is also a Group IV element. Other Group IV elements can also be used. Utilizing germanium implantation, for example, at a dose greater than about $1 \times 10^{14}$ $Ge^+/cm^2$ will result in the polysilicon being amorphized, which will permit more complete incorporation of the active dopants into incipient microcrystals upon annealing. Germanium, as pointed out above, can be incorporated into the silicon crystal lattice. Furthermore, germanium can be used to control the diffusion of both n-type and p-type dopant species. Germanium, like the noble gases, tends to accumulate at grain boundaries. Such accumulation of germanium at grain boundaries will tend to increase the electrical activity of active dopant species in the polysilicon, because the germanium accumulation at the grain boundaries prevents the active dopant species from accumulating at the grain boundaries. Furthermore, since germanium is intrinsically a very low resistivity material itself, the resistivity of the polysilicon into which the germanium is implanted will be reduced.

Figure 2:
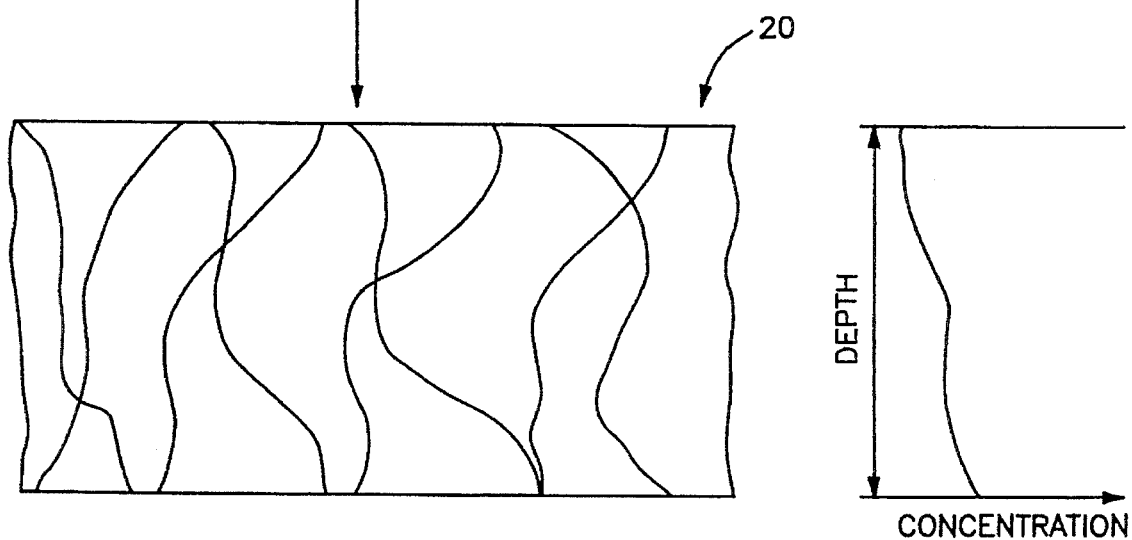
FIG. 2 illustrates the relative boron distribution in the polysilicon layer of FIG. 1 following annealing.

Referring to FIG. 1, one form of the invention is illustrated. A 250 nm thick polysilicon layer 10 containing grain boundaries 12 and an amorphous region 14 implanted with boron using a dosage of $2 \times 10^{15}$ $BF_2^+/cm^2$ at 90 keV is implanted with neon using $1 \times 10^{15}$ $Ne^+/cm^2$ at 20 keV. The resulting doped polysilicon layer is then annealed in nitrogen at 875° C. for 30 minutes, resulting in the disappearance of amorphous region 14 as shown in the polysilicon layer 20. The relative boron concentration profile of the annealed layer 20 is shown in FIG. 2. The process illustrated in FIG. 1 and FIG. 2 is useful for enhancing the boron distribution to the bottom of the polysilicon layer.

FIG. 3 illustrates another form of the invention. Here the polysilicon layer is implanted with argon using a dosage of $1 \times 10^{15}$ $Ar^+/cm^2$ at 100 keV. Following the argon implantation boron is implanted using $2 \times 10^{15}$ $BF_2^+/cm^2$ at 90 keV. The resulting doped polysilicon layer is then annealed in nitrogen at 875° for 30 minutes, resulting in the disappearance of amorphous region 14 as shown in the polysilicon layer 30. The relative boron concentration profile of the annealed layer 30 is shown in FIG. 4. The process illustrated in FIG. 3 and FIG. 4 is useful for retarding the boron distribution to the bottom of the polysilicon layer.

The invention will be better understood by reference to the following non-limiting examples.

EXAMPLE 1

Figure 5:
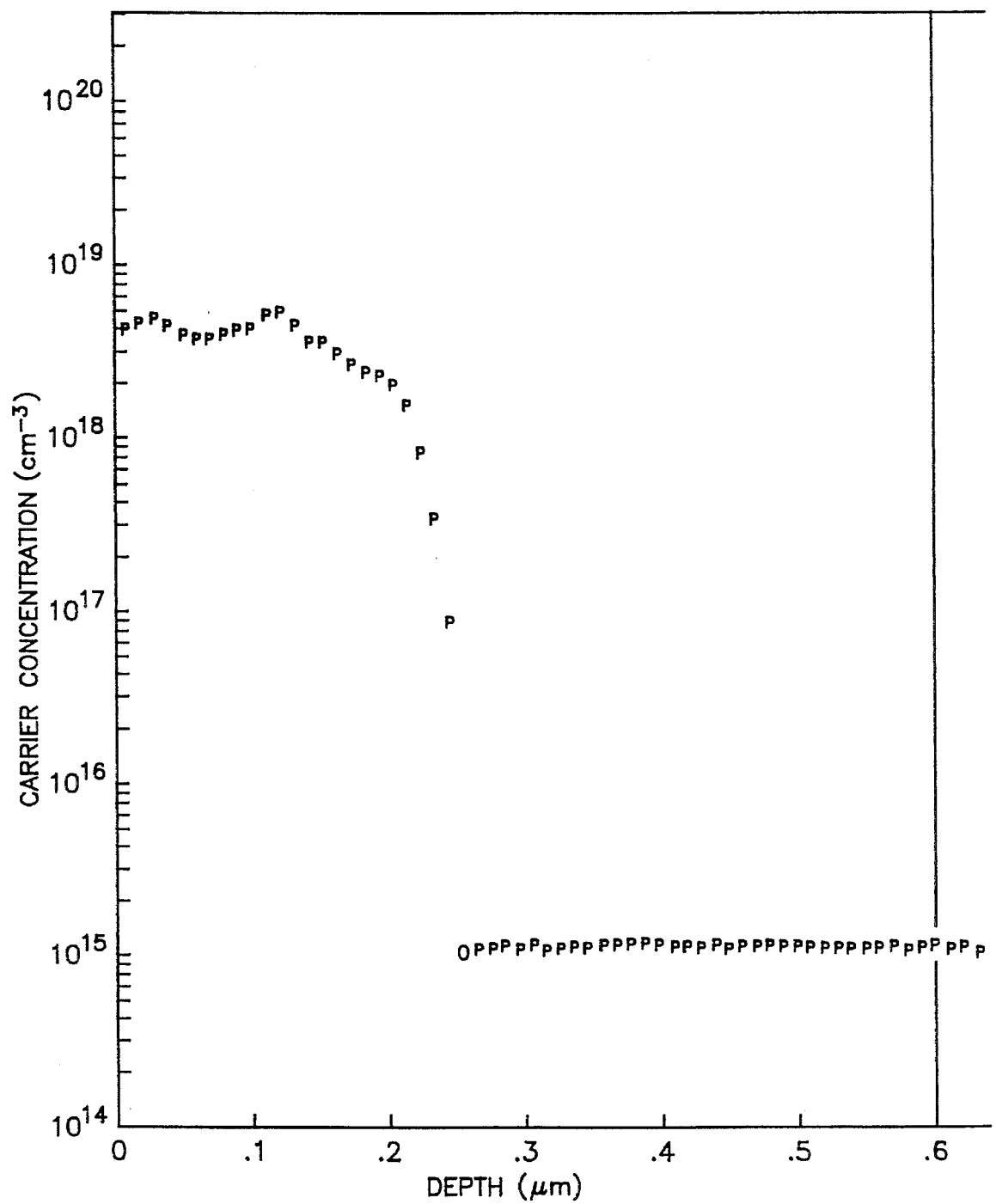
FIG. 5 shows the spreading resistance profile (SRP) of p-type dopant concentrations in a polysilicon layer deposited upon a silicon oxide layer on single crystal silicon, which polysilicon layer has been implanted with argon and boron.
Figure 6:
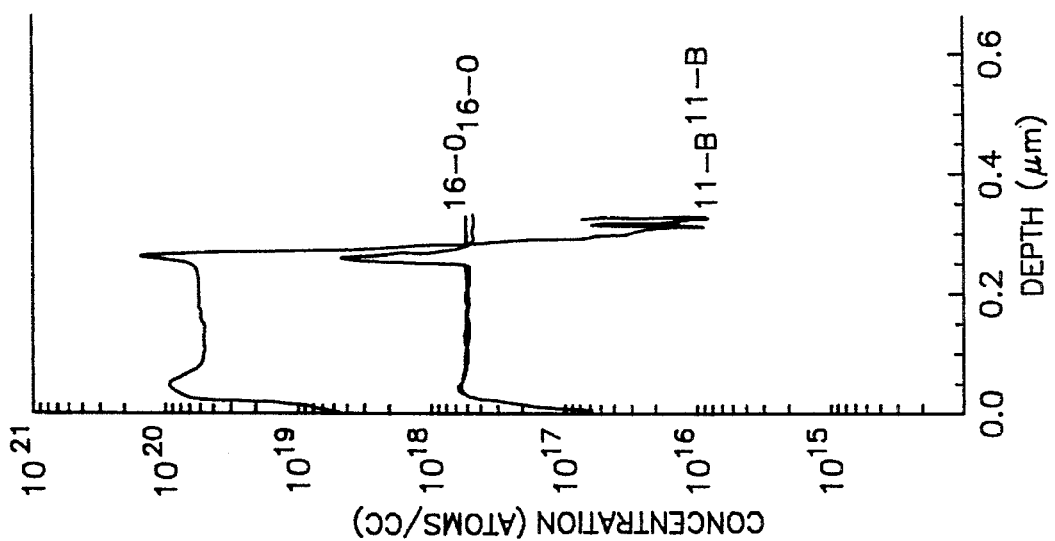
FIG. 6 shows the secondary ion mass spectrometry (SIMS) boron profile of a polysilicon layer having the carrier distribution shown in FIG. 5.

Upon a p-type single crystal silicon wafer was thermally grown a 60 Angstrom layer of silicon dioxide. A 250 nm layer of polysilicon was deposited upon the silicon dioxide layer. Only boron at $2 \times 10^{15}$ $BF_2^+/cm^2$ at 50 keV without argon was implanted (i.e. no argon was implanted). In FIG. 5 there is displayed the carrier profile when no argon is present. Similarly, FIG. 6 shows the boron concentration profile when no argon is present.

EXAMPLE 2

Figure 8:
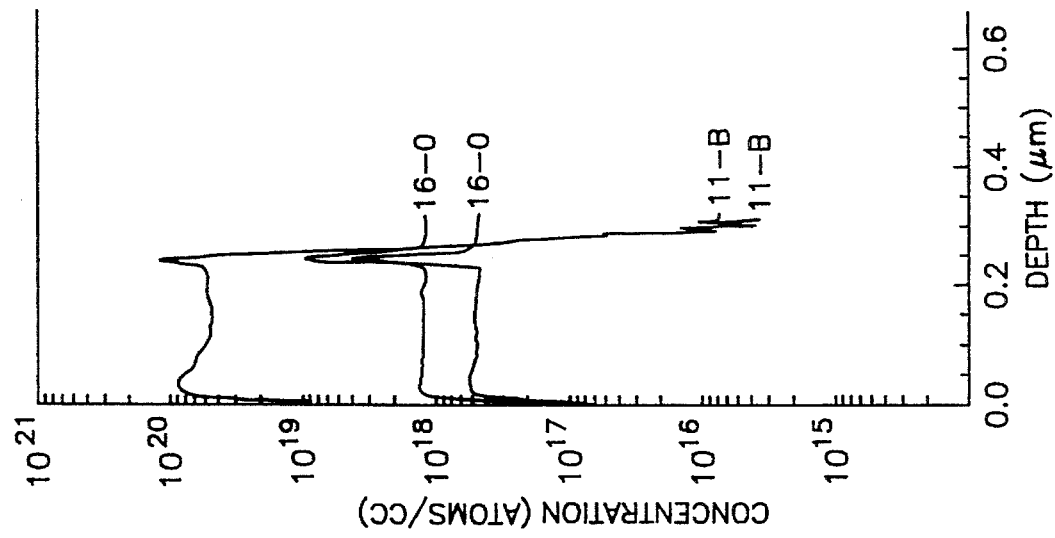
FIG. 8 shows the SIMS boron profile of a polysilicon layer having the carrier distribution shown in FIG. 7.
Figure 7:
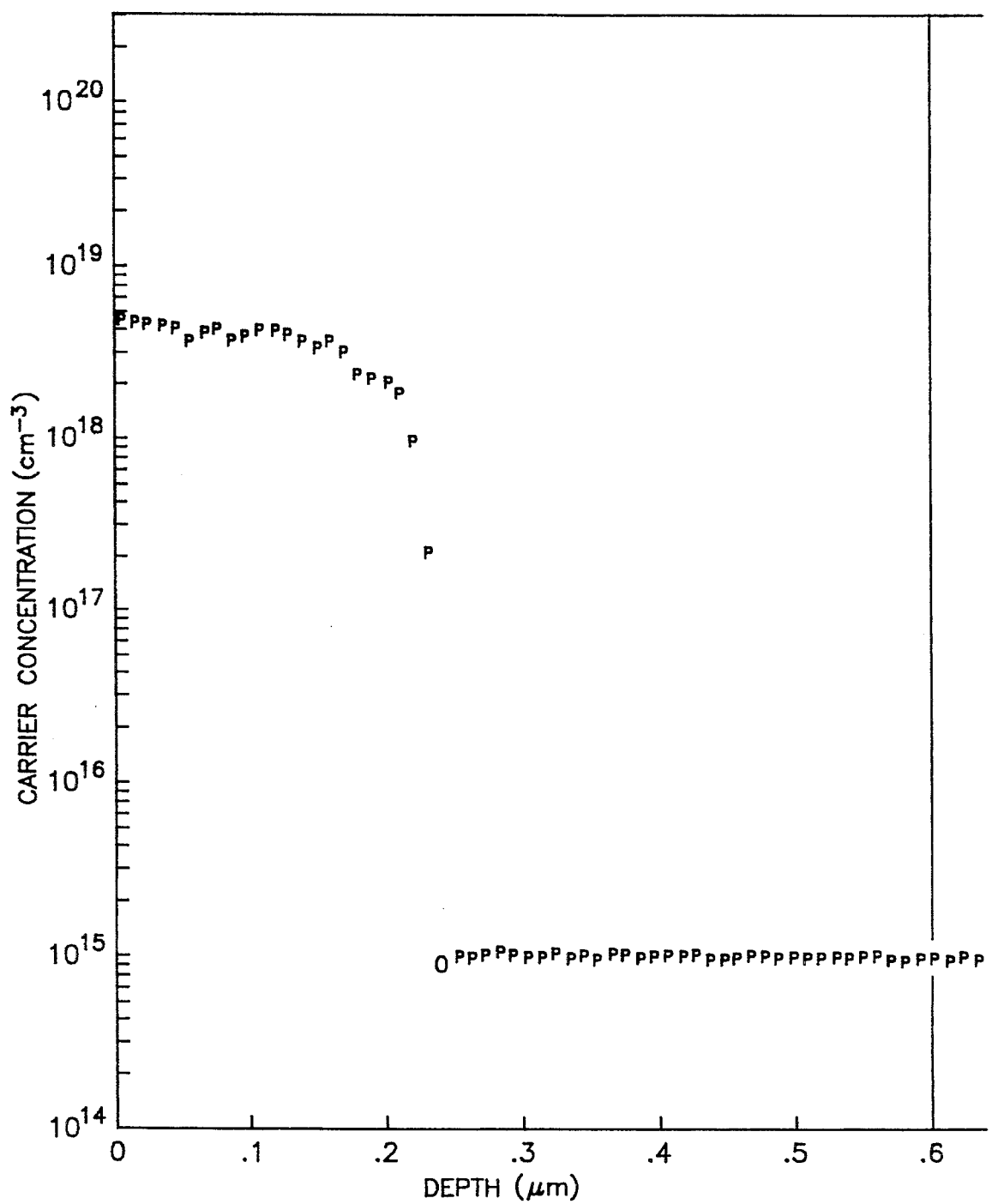
FIG. 7 shows the SRP of p-type carrier concentrations in a polysilicon layer implanted with boron and twice the dose of argon of that shown in FIG. 5.

Argon was implanted into the polysilicon layer by ion implantation using $1 \times 10^{15}$ $Ar^+/cm^2$ at 60 keV. Boron was then implanted using $2 \times 10^{15}$ $BF_2^+/cm^2$ at 50 keV. The wafer was annealed in nitrogen at 850° C. for 30 minutes. A spreading resistance profile (SRP) was measured as a function of depth according to NBS Spec. Publ. 400–48 (May, 1979), D. M. Dickey and J. R. Ehrstein, "Semiconductor Measurement Technology: Spreading Resistance Analysis For Silicon Layers With Nonuniform Resistivity", which is incorporated herein by reference. The results are shown in FIG. 7 wherein p-type carrier concentration per $cm^3$ is plotted versus depth in micrometers. Duplicate runs of boron profiles from secondary ion mass spectrometry (SIMS) are shown in FIG. 8. A comparison of FIG. 7 and FIG. 8 shows that boron accumulates in the region of the polysilicon where the argon concentration is greatest.

EXAMPLE 3

Figure 10:
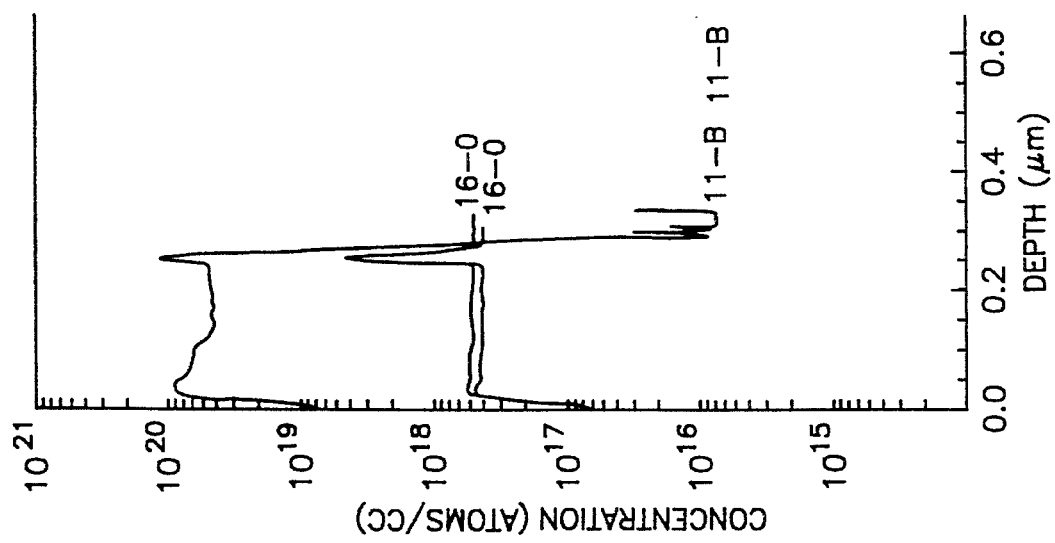
FIG. 10 shows the SIMS boron profile of a polysilicon layer having the carrier distribution shown in FIG. 9.
Figure 9:
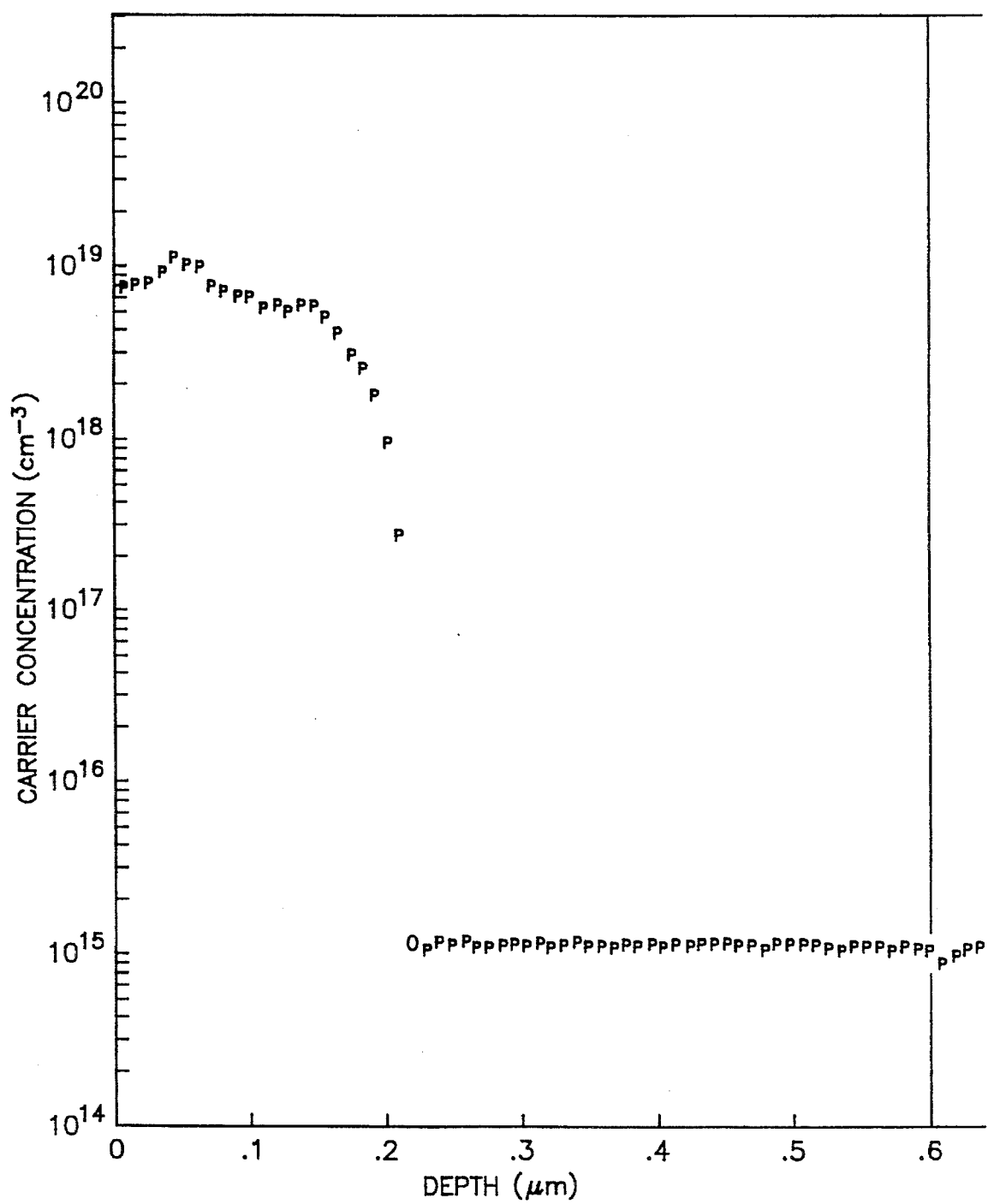
FIG. 9 shows the SRP p-type carrier concentrations in a polysilicon layer implanted only with boron.

The procedure of Example 1 was followed except that the dose of implanted argon was doubled to $2 \times 10^{15}$ $Ar^+/cm^2$. The results are shown in FIG. 9 and FIG. 10. Comparing FIG. 8 with FIG. 10 indicates that more boron accumulates in the sample with the higher argon dose.

The present invention provides a simple and convenient way to control dopant distribution and activation in polysilicon, which can be utilized in thin film transistors, solar cells, gate contacts in MOS devices, resistors in integrated circuits and interconnections.

Having thus described the invention, what is claimed is:

1. A process for controlling dopant distribution and activation in polysilicon which comprises:

implanting into polysilicon a dopant and an atomic species which is electrically neutral in said polysilicon and is capable of interacting with said dopant, said atomic species being characterized by accumulating along grain boundaries and being capable of blocking diffusion of said dopant along said grain boundaries of said polysilicon; and annealing the resulting polysilicon containing said dopant and said atomic species.

2. The process of claim 1 wherein said atomic species is further characterized as being incapable of entering into substitutional sites in a silicon crystal lattice.

3. The process of claim 1 wherein said atomic species is a noble gas.

4. The process of claim 3 wherein said noble gas is capable of forming a complex with said dopant.

5. The process of claim 4 wherein said noble gas is argon.

6. The process of claim 3 wherein atoms of said noble gas are capable of repelling said dopant.

7. The process of claim 6 wherein said noble gas is neon.

8. The process of claim 1 wherein said atomic species is implanted into polysilicon at a dose which is effective to amorphize regions of said polysilicon.

9. The process of claim 8 wherein said atomic species is a noble gas and said dose is at least about $1 \times 10^{15}$ atoms per square centimeter.

10. The process of claim 1 wherein said atomic species is further characterized as being capable of entering into substitutional sites in a silicon crystal lattice.

11. The process of claim 1 wherein said atomic species is a Group IV element other than silicon.

12. The process of claim 11 wherein said Group IV element is germanium.

13. The process of claim 8 wherein said atomic species is a Group IV element and said dose is at least about $1 \times 10^{14}$ atoms per square centimeter.

14. A process for controlling the distribution and activation of dopant in a polysilicon layer which comprises:

ion implanting boron into said polysilicon layer, ion implanting a predetermined dose of neon into the boron-containing polysilicon layer; and annealing said boron- and neon-containing polysilicon layer, thereby providing a boron doped polysilicon layer having a predetermined boron concentration profile wherein boron distribution to the bottom of said polysilicon layer has been enhanced.

15. The process of claim 14 wherein said boron is implanted at a dose of about $2 \times 10^{15}$ $BF_2^+/cm^2$ at 90 keV, said neon is implanted at a dose of about $1 \times 10^{15}$ $Ne^+/cm^2$ at about 20 keV, and said annealing step is performed in nitrogen at about 875° C. for about 30 minutes.

16. A process for controlling the distribution and activation of dopant in a polysilicon layer which comprises:

ion implanting a predetermined dose of argon into said polysilicon layer, ion implanting boron into said polysilicon layer, and annealing said boron- and argon-containing polysilicon layer, whereby providing a boron doped polysilicon layer having a predetermined boron concentration profile wherein boron distribution to the bottom of said polysilicon layer has been retarded.

17. The process of claim 16 wherein said argon is implanted at a dose of about $1 \times 10^{15}$ $Ar^+/cm^2$ at about 100 keV, said boron is implanted at a dose of about $2 \times 10^{15}$ $BF_2^+/cm^2$ at about 90 keV, and said annealing step is performed in nitrogen at about 875° for about 30 minutes.

18. The process of claim 16 wherein said argon is implanted at a dose of about $1 \times 10^{15}$ $Ar^+/cm^2$ to $2 \times 10^{15}$ $Ar^+/cm^2$ at about 60 keV, said boron is implanted at a dose of about $2 \times 10^{15}$ $BF_2^+/cm^2$ at about 50 keV, and said annealing step is performed in nitrogen at about 850° C. for about 30 minutes.

19. A semiconductor structure having predetermined dopant distribution which comprises:

a polysilicon layer containing dopant species and an atomic species which is electrically neutral in said polysilicon and is capable of interaction with said dopant species, said atomic species being accumulated along grain boundaries and blocking diffusion of dopant along said grain boundaries of said polysilicon layer, said atomic species being present in a predetermined concentration such that interaction with dopant species provides a predetermined distribution profile.

20. The semiconductor structure of claim 19 wherein said atomic species is incapable of entering into substitutional sites in a silicon crystal lattice.

21. The semiconductor structure of claim 19 wherein said atomic species is a noble gas.

22. The semiconductor structure of claim 21 wherein said noble gas is argon.

23. The semiconductor structure of claim 21 wherein said noble gas is neon.

24. The semiconductor structure of claim 19 wherein said atomic species is capable of entering into substitutional sites in a silicon crystal lattice.

25. The semiconductor structure of claim 19 wherein said atomic species is a Group IV element other than silicon.

26. The semiconductor structure of claim 25 wherein said Group IV element is germanium.

27. A semiconductor structure which comprises a polysilicon layer prepared according to the process of claim 1.

28. A semiconductor structure which comprises a polysilicon layer prepared according to the process of claim 14.

29. A semiconductor structure which comprises a polysilicon layer prepared according to the process of claim 16.

* * * * *